(12) United States Patent
Vogelsang et al.

(10) Patent No.: US 7,254,089 B2
(45) Date of Patent: Aug. 7, 2007

(54) MEMORY WITH SELECTABLE SINGLE CELL OR TWIN CELL CONFIGURATION

(75) Inventors: Thomas Vogelsang, Jericho, VT (US); Harald Lorenz, South Burlington, VT (US); Wolfgang Hokenmaier, Burlington, VT (US)

(73) Assignee: Infineon Technologies AG, Munich (DE)

( * ) Notice: Subject to any disclaimer, the term of this patent is extended or adjusted under 35 U.S.C. 154(b) by 116 days.

(21) Appl. No.: 11/025,561

(22) Filed: Dec. 29, 2004

(65) Prior Publication Data

US 2006/0140040 A1    Jun. 29, 2006

(51) Int. Cl.
*G11C 8/00* (2006.01)

(52) U.S. Cl. .............................. 365/230.06; 365/230.01

(58) Field of Classification Search ........... 365/230.01, 365/230.03, 230.06
See application file for complete search history.

(56) References Cited

U.S. PATENT DOCUMENTS

| 6,452,859 B1 | 9/2002 | Shimano et al. |
| 6,714,476 B2 | 3/2004 | Hsu et al. |
| 6,829,192 B2 * | 12/2004 | Shinozaki et al. .......... 365/222 |
| 2002/0093864 A1 | 7/2002 | Ooishi |
| 2002/0141228 A1 | 10/2002 | Fujino |
| 2003/0086316 A1 | 5/2003 | Kurjanowicz et al. |
| 2003/0173593 A1 | 9/2003 | Miyatake et al. |
| 2004/0141361 A1 | 7/2004 | Tsukikawa et al. |
| 2004/0156255 A1 | 8/2004 | Tsukikawa |

OTHER PUBLICATIONS

A copy of PCT International Search Report for International Application No. PCT/EP2005/014005 mailed on May 30, 2006 (5 pages).

\* cited by examiner

*Primary Examiner*—VanThu Nguyen
(74) *Attorney, Agent, or Firm*—Dicke, Billig & Czaja, PLLC

(57) ABSTRACT

A memory circuit comprises a memory including a memory array, a twin cell mode predecoder, and a row address predecoder. The memory array comprises word lines. The twin cell mode predecoder is configured for selecting one of four word line activation configurations for the memory array. The four word line activation configurations include three twin cell word line activation configurations and a single cell word line activation configuration. The row address predecoder is configured for selecting one of four word lines if the single cell word line activation configuration is selected.

19 Claims, 8 Drawing Sheets

MEMORY WITH SELECTABLE SINGLE CELL OR TWIN CELL CONFIGURATION

BACKGROUND

The dynamic random access memory (DRAM) market shows a growing need for DRAM products that consume very little power. DRAM products that consume very little power in a standby mode in a mobile application, such as in a cellular phone or other portable electronic device, are especially in demand. A DRAM memory cell needs to be refreshed during standby mode to maintain the information stored in the memory cell. An increase in the time between refreshes of memory cells reduces the amount of power consumed by the memory cells in a standby mode. The time between refreshes of memory cells is limited by the data retention time of the memory cells. Since the time between refreshes is the same for all memory cells in an array of memory cells, the refresh limit is based on the data retention time not of the average memory cell in the array of memory cells, but of the worst memory cell in the array of memory cells.

Using two memory cells to store a single bit of data significantly increases the data retention time. The data retention time increases since there is a high probability that a bad memory cell will be combined with an average memory cell. The resulting combined data retention time will then be much closer to the average data retention time. It is advantageous, however, to test and repair a memory using a single cell configuration to find and replace the worst cells based on single cell test results so that the worst cells are identified more easily and the redundancy in the array of memory cells is used more effectively.

For low power and/or battery powered applications, such as cellular phones and other portable electronic devices, memories that conserve power are desired. These memories may include dynamic random access memories (DRAMs), synchronous dynamic random access memories (SDRAMs), double data rate synchronous dynamic random access memories (DDR SDRAMs), double data rate II synchronous dynamic random access memories (DDR2 SDRAMs), pseudo static random access memories (PSRAMs), cellular random access memories (Cellular RAMs), and mobile random access memories (Mobile RAMs).

SUMMARY

One embodiment of the present invention provides a memory circuit. The memory circuit comprises a memory including a memory array, a twin cell mode predecoder, and a row address predecoder. The memory array comprises word lines. The twin cell mode predecoder is configured for selecting one of four word line activation configurations for the memory array. The four word line activation configurations include three twin cell word line activation configurations and a single cell word line activation configuration. The row address predecoder is configured for selecting one of four word lines if the single cell word line activation configuration is selected.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
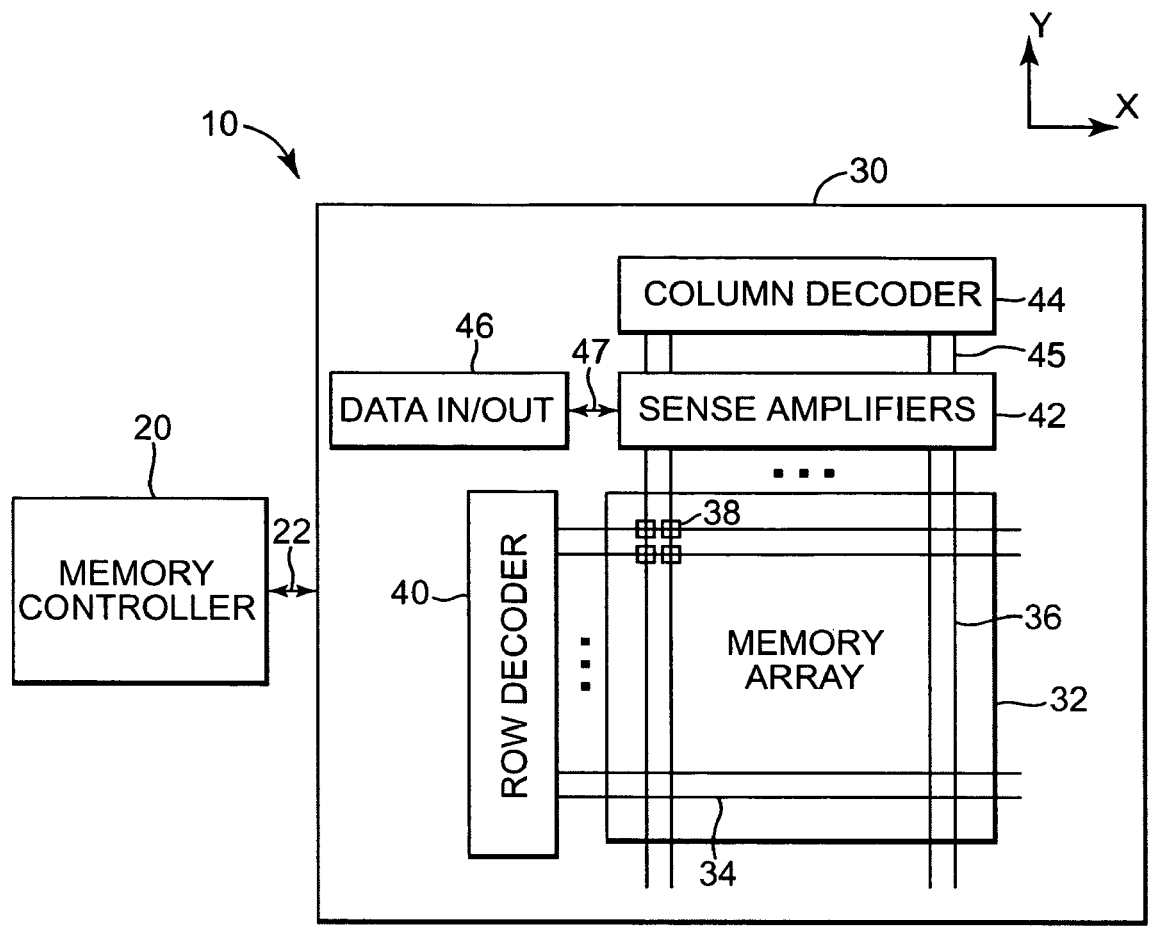
FIG. 1 is a block diagram illustrating one embodiment of a dynamic random access memory, according to the present invention.

FIG. 1 is a block diagram illustrating one embodiment of a memory 10. In one embodiment, memory 10 is a random access memory (RAM), such as a dynamic random access memory (DRAM), synchronous dynamic random access memory (SDRAM), double data rate synchronous dynamic random access memory (DDR SDRAM), double data rate II synchronous dynamic random access memory (DDR2 SDRAM), pseudo-static random access memory (PSRAM), cellular random access memory (Cellular RAM), or mobile random access memory (Mobile RAM). Memory 10 includes a memory controller 20 and at least one memory bank 30. Memory bank 30 includes an array of memory cells 32, a row decoder 40, a column decoder 44, sense amplifiers 42, and data in/out circuit 46. Memory controller 20 is electrically coupled to memory bank 30 through communication link 22.

Memory 10 is configured to be tested and/or operated in either a single cell mode or configuration or a twin cell mode or configuration. Memory 10 includes three twin cell modes based on the selection of two of four word lines driven by a master word line. The first twin cell mode pairs the first and second word lines and the third and fourth word lines driven by a master word line. The second twin cell mode pairs the first and fourth word lines and the second and third word lines driven by a master word line. The third twin cell mode pairs the first and third word lines and the second and fourth word lines driven by a master word line. In one embodiment, memory 10 is tested and/or repaired in the single cell mode and operated in a twin cell mode. In one embodiment, memory 10 is repaired by substituting redundant memory cells for memory cells found defective during testing. In one form of the invention, memory 10 is configured to be permanently set to operate in the single cell mode or in one of the three twin cell modes.

Conductive word lines 34, referred to as row select lines, extend in the x-direction across the array of memory cells 32. Conductive bit lines 36 extend in the y-direction across the array of memory cells 32. A memory cell 38 is located at each cross point of a word line 34 and a bit line 36. In one embodiment, the array of memory cells 32 is arranged in a tcct topology. In another embodiment, the array of memory cells 32 is arranged in a checkerboard topology. Each word line 34 is electrically coupled to row decoder 40. Each set of four adjacent word lines are driven by a master word line. Each bit line 36 is electrically coupled to a sense amplifier 42. The sense amplifiers 42 are electrically coupled to column decoder 44 through conductive column decoder lines 45 and to data in/out circuit 46 through data lines 47.

Data in/out circuit 46 includes a plurality of latches and data input/output (I/O) pads or pins (DQs) to transfer data between memory bank 30 and an external device. Data to be written into memory bank 30 is presented as voltages on the DQs from an external device. The voltages are translated into the appropriate signals and stored in selected memory cells 38. Data read from memory bank 30 is presented by memory bank 30 on the DQs for an external device to retrieve. Data read from selected memory cells 38 appears at the DQs once access is complete and the output is enabled. At other times, the DQs are in a high impedance state.

Memory controller 20 controls reading data from and writing data to memory bank 30. During a read operation, memory controller 20 passes the row address of a selected memory cell or cells 38 to row decoder 40. In the single cell mode, row decoder 40 activates the selected word line 34. In a twin cell mode, row decoder 40 activates two selected word lines 34. In the single cell mode, as the selected word line 34 is activated, the value stored in each memory cell 38 coupled to the selected word line 34 is passed to the respective bit line 36. In the twin cell mode, as the selected word lines 34 are activated, the value stored in each memory cell 38 coupled to the selected word lines 34 is passed to the respective bit lines 36. The value of each memory cell 38 is read by a sense amplifier 42 electrically coupled to the respective bit line 36. Memory controller 20 passes a column address of the selected memory cell or cells 38 to column decoder 44. Column decoder 44 selects which sense amplifiers 42 pass data to data in/out circuit 46 for retrieval by an external device.

During a write operation, the data to be stored in array 32 is placed in data in/out circuit 46 by an external device. Memory controller 20 passes the row address for the selected memory cell or cells 38 where the data is to be stored to row decoder 40. In the single cell mode, row decoder 40 activates the selected word line 34. In a twin cell mode, row decoder 40 activates the selected word lines 34. Memory controller 20 passes the column address for the selected memory cell or cells 38 where the data is to be stored to column decoder 44. Column decoder 44 selects which sense amplifiers 42 are passed the data from data in/out circuit 46. Sense amplifiers 42 write the data to the selected memory cell or cells 38 through bit lines 36.

Figure 2:
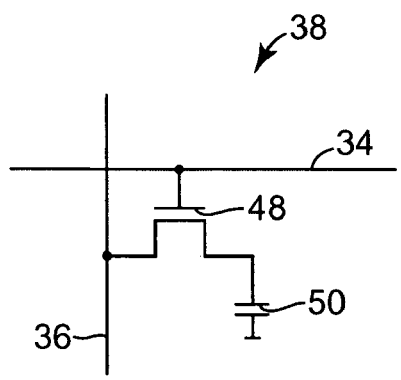
FIG. 2 is a diagram illustrating one embodiment of a memory cell.

FIG. 2 is a diagram illustrating one embodiment of one memory cell 38 in the array of memory cells 32. Memory cell 38 includes a transistor 48 and a capacitor 50. The gate of transistor 48 is electrically coupled to word line 34. The drain-source path of transistor 48 is electrically coupled to bit line 36 and capacitor 50. Capacitor 50 is charged to represent either a logic '0' or a logic '1.' During a read operation, word line 34 is activated to turn on transistor 48 and the value stored on capacitor 50 is read by a corresponding sense amplifier 42 through bit line 36 and transistor 48. During a write operation, word line 34 is activated to turn on transistor 48 and the value stored on capacitor 50 is written by a corresponding sense amplifier 42 through bit line 36 and transistor 48.

The read operation on memory cell 38 is a destructive read operation. After each read operation, capacitor 50 is recharged with the value that was just read. In addition, even without read operations, the charge on capacitor 50 discharges over time. To retain a stored value, memory cell 38 is refreshed periodically by reading or writing the memory cell 38. All memory cells 38 within the array of memory cells 32 are periodically refreshed to maintain their values.

The refresh rate for the single cell mode is greater than the refresh rate for a twin cell mode. The lower refresh rate for a twin cell mode conserves power in memory 10. The lower refresh rate for a twin cell mode extends the battery life of a cellular phone or other portable electronic device in which memory 10 is used.

Figure 3:
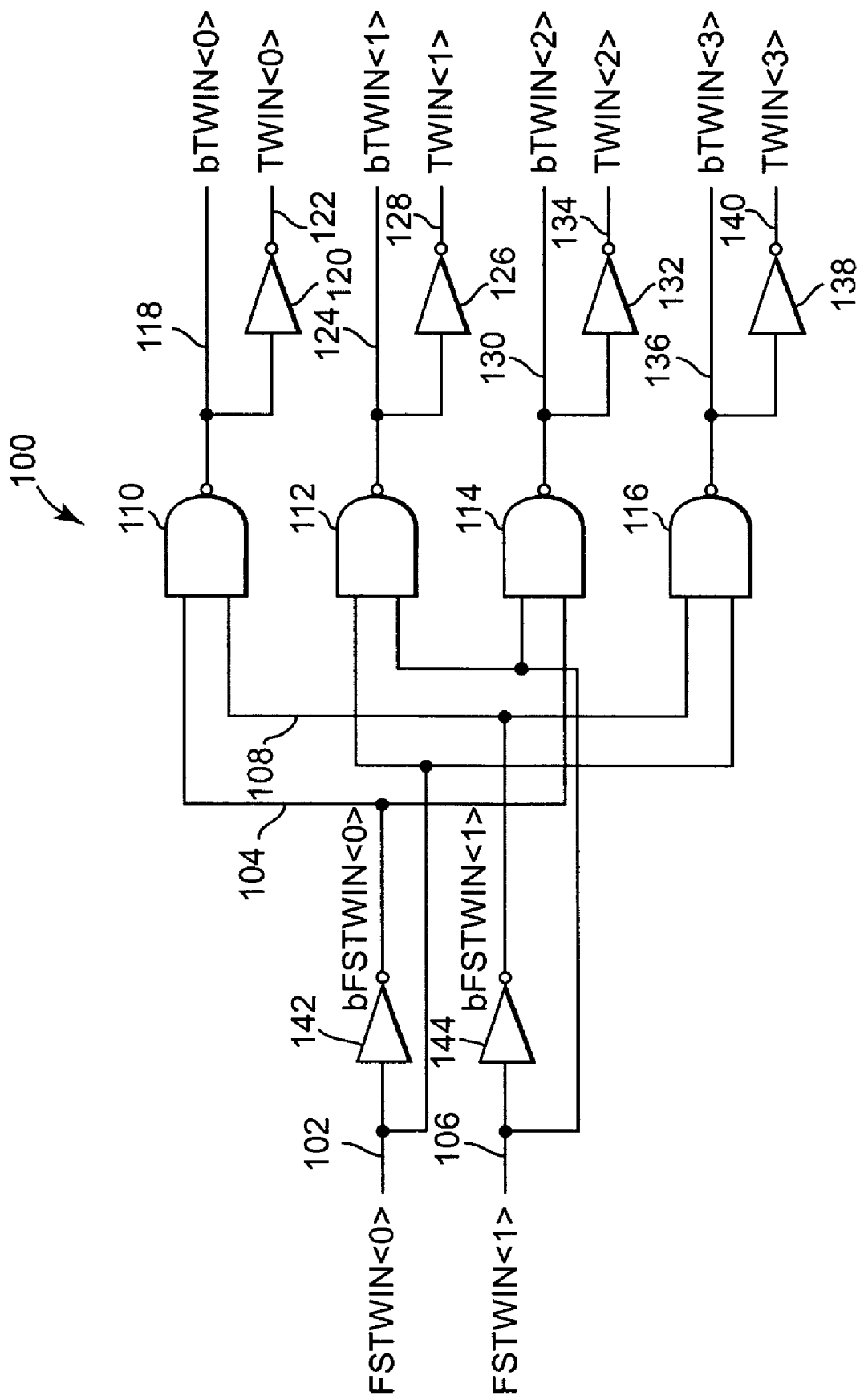
FIG. 3 is a schematic diagram illustrating one embodiment of a twin cell mode predecoder.

FIG. 3 is a schematic diagram illustrating one embodiment of a twin cell mode predecoder 100. In one embodiment, twin cell mode predecoder 100 is part of row decoder 40. Twin cell mode predecoder 100 includes inverters 142, 144, 120, 126, 132, and 138, and NAND gates 110, 112, 114, and 116. The input of inverter 142, a first input of NAND gate 112, and a first input of NAND gate 116 receive the twin cell select zero (FSTWIN<0>) signal on FSTWIN<0> signal path 102. The output of inverter 142 is electrically coupled to a first input of NAND gate 110 and a first input of NAND gate 114 through inverted twin cell select zero (bFSTWIN<0>) signal path 104. The input of inverter 144, a second input of NAND gate 112, and a second input of NAND gate 114 receive the twin cell select signal one (FSTWIN<1>) signal on FSTWIN<1> signal path 106. The output of inverter 144 is electrically coupled to a second input of NAND gate 110 and a second input of NAND gate 116 through inverted twin cell select one (bFSTWIN<1>) signal path 108.

The output of NAND gate 110 is electrically coupled to the input of inverter 120 through inverted twin zero (bTWIN<0>) signal path 118. The output of inverter 120 provides the twin zero (TWIN<0>) signal on TWIN<0> signal path 122. The output of NAND gate 112 is electrically coupled to the input of inverter 126 through inverted twin one (bTWIN<1>) signal path 124. The output of inverter 126 provides the twin one (TWIN<1>) signal on TWIN<1> signal path 128. The output of NAND gate 114 is electrically coupled to the input of inverter 132 through inverted twin two (bTWIN<2>) signal path 130. The output of inverter 132 provides the twin two (TWIN<2>) signal on TWIN<2> signal path 134. The output of NAND gate 116 is electrically coupled to the input of inverter 138 through inverted twin three (bTWIN<3>) signal path 136. The output of inverter 138 provides the twin three (TWIN<3>) signal on TWIN<3> signal path 140.

The FSTWIN<0> signal and the FSTWIN<1> signal are set for selecting the single cell mode or desired twin cell mode. In one embodiment, the FSTWIN<0> signal and the FSTWIN<1> signal are temporarily set for testing memory 10 in a single cell mode and then permanently set for operating memory 10 in either the single cell mode or one of the three twin cell modes. In one form of the invention, the FSTWIN<0> signal and the FSTWIN<1> signal are provided by memory controller 20 through communication link 22. In one embodiment, the FSTWIN<0> signal and the FSTWIN<1> signal are permanently set by fusing, bonding, or other suitable means.

Inverter 142 inverts the FSTWIN<0> signal on FSTWIN<0> signal path 102 to provide the bFSTWIN<0> signal on bFSTWIN<0> signal path 104. Inverter 144 inverts the FSTWIN<1> signal on FSTWIN<1> signal path 106 to provide the bFSTWIN<1> signal on bFSTWIN<1> signal path 108.

NAND gate 110 receives the bFSTWIN<0> signal on bFSTWIN<0> signal path 104 and the bFSTWIN<1> signal on bFSTWIN<1> signal path 108 to provide the bTWIN<0> signal on bTWIN<0> signal path 118. In response to a logic high bFSTWIN<0> signal and a logic high bFSTWIN<1> signal, NAND gate 110 outputs a logic low bTWIN<0> signal. In response to a logic low bFSTWIN<0> signal or a logic low bFSTWIN<1> signal, NAND gate 110 outputs a logic high bTWIN<0> signal. Inverter 120 inverts the bTWIN<0> signal on bTWIN<0> signal path 118 to provide the TWIN<0> signal on TWIN<0> signal path 122.

NAND gate 112 receives the FSTWIN<0> signal on FSTWIN<0> signal path 102 and the FSTWIN<1> signal on FSTWIN<1> signal path 106 to provide the bTWIN<1> signal on bTWIN<1> signal path 124. In response to a logic high FSTWIN<0> signal and a logic high FSTWIN<1> signal, NAND gate 112 outputs a logic low bTWIN<1> signal. In response to a logic low FSTWIN<0> signal or a logic low FSTWIN<1> signal, NAND gate 112 outputs a logic high bTWIN<1> signal. Inverter 126 inverts the bTWIN<1> signal on bTWIN<1> signal path 124 to provide the TWIN<1> signal on TWIN<1> signal path 128.

NAND gate 114 receives the FSTWIN<1> signal on FSTWIN<1> signal path 106 and the bFSTWIN<0> signal on bFSTWIN<0> signal path 104 to provide the bTWIN<2> signal on bTWIN<2> signal path 130. In response to a logic high FSTWIN<1> signal and a logic high bFSTWIN<0> signal, NAND gate 114 outputs a logic low bTWIN<2> signal. In response to a logic low FSTWIN<1> signal or a logic low bFSTWIN<0> signal, NAND gate 114 outputs a logic high bTWIN<2> signal. Inverter 132 inverts the bTWIN<2> signal on bTWIN<2> signal path 130 to provide the TWIN<2> signal on TWIN<2> signal path 134.

NAND gate 116 receives the bFSTWIN<1> signal on bFSTWIN<1> signal path 108 and the FSTWIN<0> signal on FSTWIN<0> signal path 102 to provide the bTWIN<3> signal on bTWIN<3> signal path 136. In response to a logic high bFSTWIN<1> signal and a logic high FSTWIN<0> signal, NAND gate 116 outputs a logic low bTWIN<3> signal. In response to a logic low bFSTWIN<1> signal or a logic low FSTWIN<0> signal, NAND gate 116 outputs a logic high bTWIN<3> signal. Inverter 138 inverts the bTWIN<3> signal on bTWIN<3> signal path 136 to provide the TWIN<3> signal on TWIN<3> signal path 140.

In operation, the FSTWIN<0> signal and the FSTWIN<1> signal are selected to provide the desired bTWIN<0:3> and TWIN<0:3> signals. In response to a logic low FSTWIN<0> signal and a logic low FSTWIN<1> signal, the first twin cell mode is selected. With the first twin cell mode selected, the bTWIN<0> signal is logic low and the TWIN<0> signal is logic high. With the first twin cell mode selected, the bTWIN<1> signal, bTWIN<2> signal, and bTWIN<3> signal are logic high, and the TWIN<1> signal, TWIN<2> signal, and TWIN<3> signal are logic low.

In response to a logic high FSTWIN<0> signal and a logic low FSTWIN<1> signal, the second twin cell mode is selected. With the second twin cell mode selected, the bTWIN<3> signal is logic low and the TWIN<3> signal is logic high. With the second twin cell mode selected, the bTWIN<0> signal, bTWIN<1> signal, and bTWIN<2> signal are logic high, and the TWIN<0> signal, TWIN<1> signal, and TWIN<2> signal are logic low.

In response to a logic low FSTWIN<0> signal and a logic high FSTWIN<1> signal, the third twin cell mode is selected. With the third twin cell mode selected, the bTWIN<2> signal is logic low and the TWIN<2> signal is logic high. With the third twin cell mode selected, the bTWIN<0> signal, bTWIN<1> signal, and bTWIN<3> signal are logic high, and the TWIN<0> signal, TWIN<1> signal, and TWIN<3> signal are logic low.

In response to a logic high FSTWIN<0> signal and a logic high FSTWIN<1> signal, the single cell mode is selected. With the single cell mode selected, the bTWIN<1> signal is logic low and the TWIN<1> signal is logic high. With the single cell mode selected, the bTWIN<0> signal, bTWIN<2> signal, and bTWIN<3> signal are logic high, and the TWIN<0> signal, TWIN<2> signal, and TWIN<3> signal are logic low.

Figure 4:
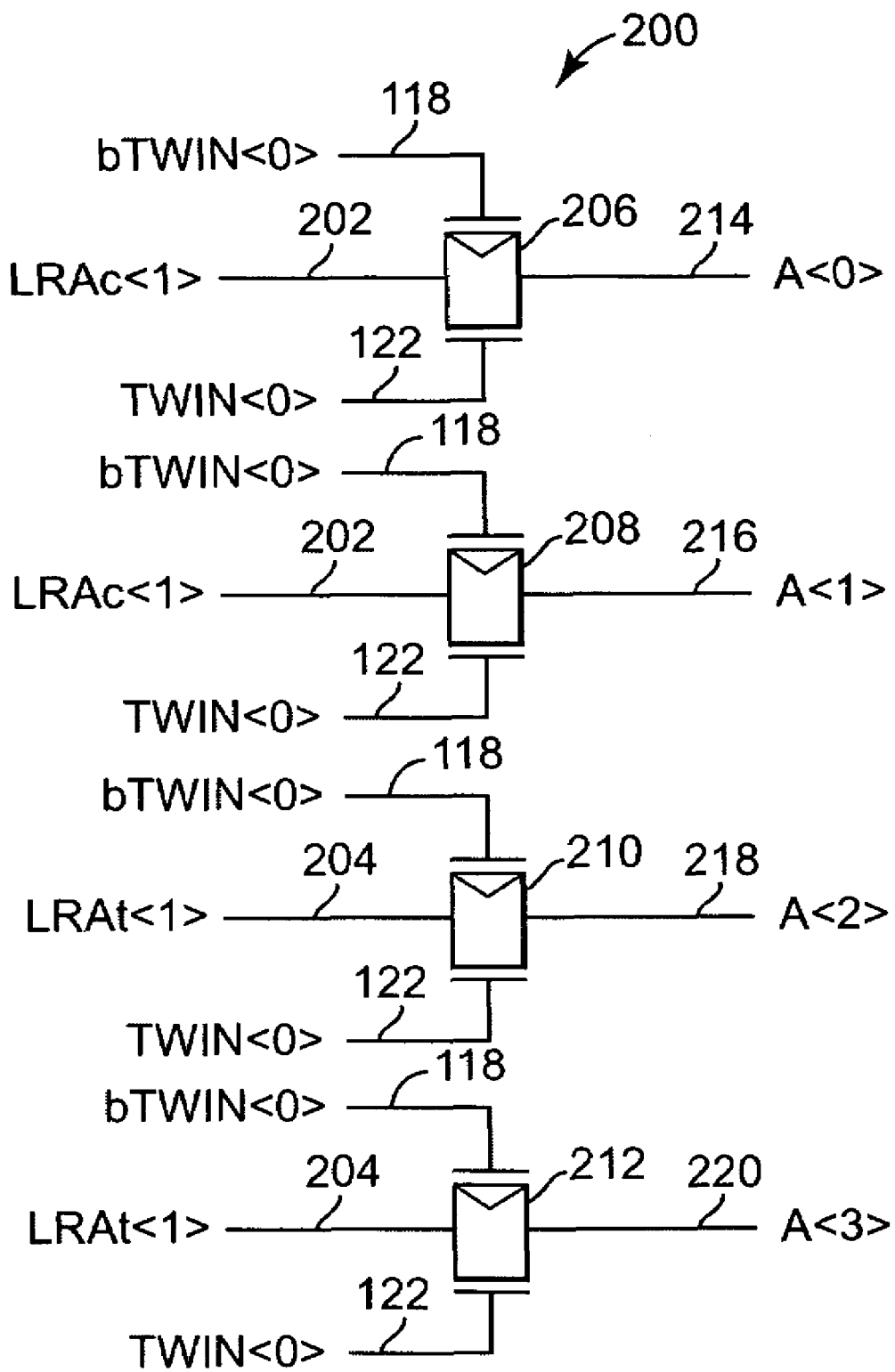
FIG. 4 is a schematic diagram illustrating one embodiment of a first portion of a row decoder for a first twin cell mode selection.

FIG. 4 is a schematic diagram illustrating one embodiment of a portion of row decoder 40 for the first twin cell mode selection. Portion 200 includes transmission gates 206, 208, 210, and 212. The input of transmission gate 206 receives a complementary row address one (LRAc<1>) signal indicating the complement of the second least significant row address bit on LRAc<1> signal path 202. In one embodiment, the LRAc<1> signal is passed from memory controller 20 though communication link 22. The output of transmission gate 206 provides an address zero (A<0>) signal on A<0> signal path 214. The logic low enable input of transmission gate 206 receives the bTWIN<0> signal on bTWIN<0> signal path 118, and the logic high enable input of transmission gate 106 receives the TWIN<0> signal on TWIN<0> signal path 122. In response to a logic high TWIN<0> signal and a logic low bTWIN<0> signal, transmission gate 206 is enabled to pass the LRAc<1> signal to A<0> signal path 214. In response to a logic low TWIN<0> signal and a logic high bTWIN<0> signal, transmission gate 206 is disabled to block the LRAc<1> signal from passing to A<0> signal path 214.

The input of transmission gate 208 receives the LRAc<1> signal on LRAc<1> signal path 202. The output of transmission gate 208 provides the address one (A<1>) signal on A<1> signal path 216. The logic low enable input of transmission gate 208 receives the bTWIN<0> signal on bTWIN<0> signal path 118, and the logic high enable input of transmission gate 208 receives the TWIN<0> signal on TWIN<0> signal path 122. In response to a logic high TWIN<0> signal and a logic low bTWIN<0> signal, transmission gate 208 is enabled to pass the LRAc<1> signal to A<1> signal path 216. In response to a logic low TWIN<0> signal and a logic high bTWIN<0> signal, transmission gate 208 is disabled to block the LRAc<1> signal from passing to A<1> signal path 216.

The input of transmission gate 210 receives the true row address one (LRAt<1>) signal indicating the true second least significant row address bit on LRAt<1> signal path 204. In one embodiment, the LRAt<1> signal is passed from memory controller 20 through communication link 22. The output of transmission gate 210 provides the address two (A<2>) signal on A<2> signal path 218. The logic low enable input of transmission gate 210 receives the bTWIN<0> signal on bTWIN<0> signal path 118, and the logic high enable input of transmission gate 210 receives the TWIN<0> signal on TWIN<0> signal path 122. In response to a logic high TWIN<0> signal and a logic low bTWIN<0> signal, transmission gate 210 is enabled to pass the LRAt<1> signal to A<2> signal path 218. In response to a logic low TWIN<0> signal and a logic high bTWIN<0> signal, transmission gate 210 is disabled to block the LRAt<1> signal from passing to A<2> signal path 218.

The input of transmission gate 212 receives the LRAt<1> signal on LRAt<1> signal path 204. The output of transmission gate 212 provides the address three (A<3>) signal on A<3> signal path 220. The logic low enable input of transmission gate 210 receives the bTWIN<0> signal on bTWIN<0> signal path 118, and the logic high enable input of transmission gate 212 receives the TWIN<0> signal on TWIN<0> signal path 122. In response to a logic high TWIN<0> signal and a logic low bTWIN<0> signal, transmission gate 212 is enabled to pass the LRAt<1> signal to A<3> signal path 220. In response to a logic low TWIN<0> signal and a logic high bTWIN<0> signal, transmission gate 212 is disabled to block the LRAt<1> signal from passing to A<3> signal path 220.

In operation, with the first twin cell mode selected to provide a logic high TWIN<0> signal and a logic low bTWIN<0> signal, the A<0> and A<1> signals are passed the LRAc<1> signal and the A<2> and A<3> signals are passed the LRAt<1> signal to activate two word lines. Therefore, if the A<0> and A<1> signals are logic low due to a logic low LRAc<1> signal, then the A<2> and A<3> signals are logic high due to a logic high LRAt<1> signal to activate the third and fourth word lines driven by a master word line. If the A<2> and A<3> signals are logic low due to a logic low LRAt<1> signal, then the A<0> and A<1> signals are logic high due to a logic high LRAc<1> to activate the first and second word lines driven by a master word line.

Figure 5:
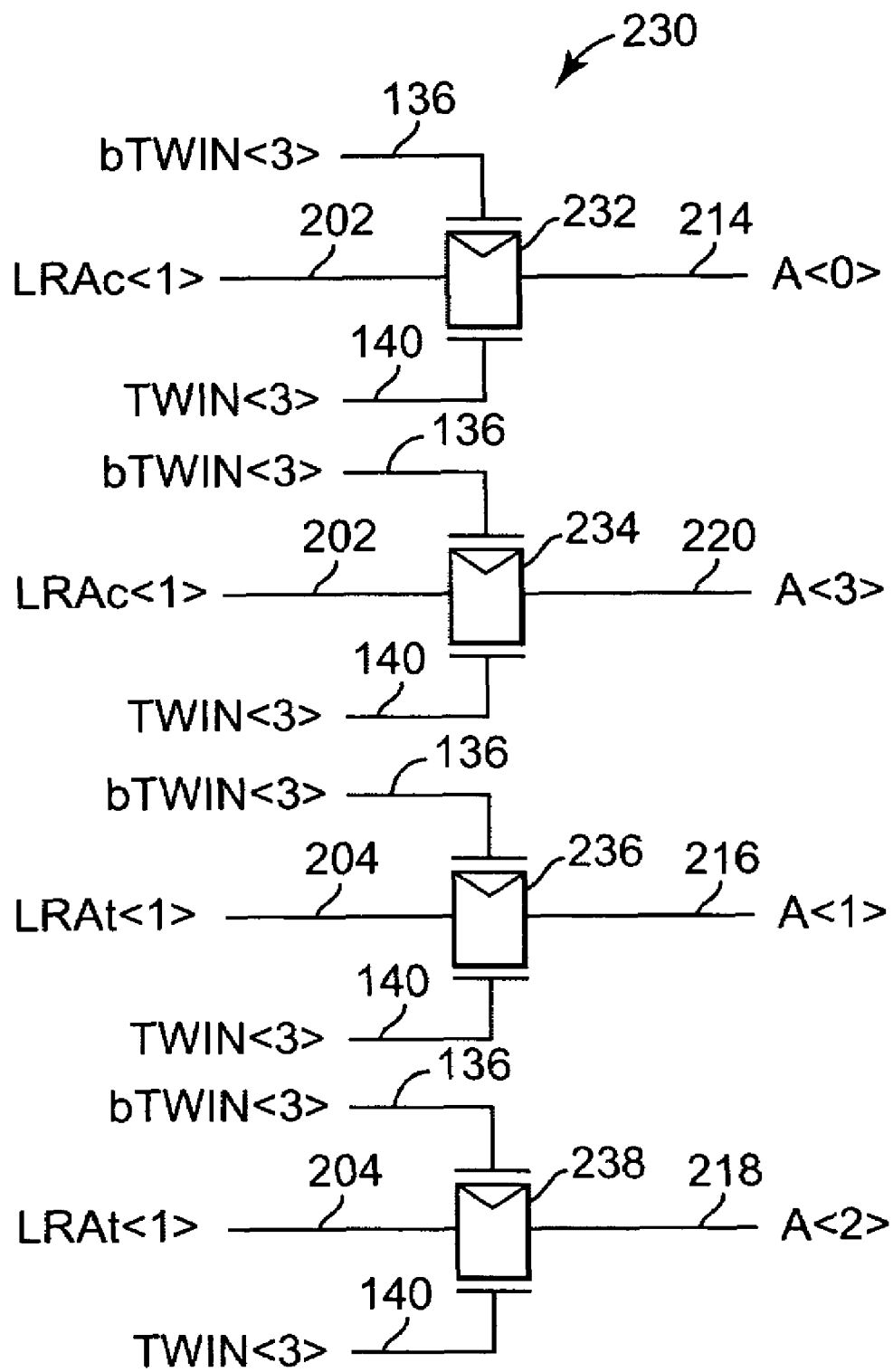
FIG. 5 is a schematic diagram illustrating one embodiment of a second portion of the row decoder for a second twin cell mode selection.

FIG. 5 is a schematic diagram illustrating one embodiment of a second portion 230 of row decoder 40 for a second twin cell mode selection. Portion 230 includes transmission gates 232, 234, 236, and 238. The input of transmission gate 232 receives the LRAc<1> signal on LRAc<1> signal path 202. The output of transmission gate 232 provides the A<0> signal on A<0> signal path 214. The logic low enable input of transmission gate 232 receives the bTWIN<3> signal on bTWIN<3> signal path 136, and the logic high enable input of transmission gate 232 receives the TWIN<3> signal on TWIN<3> signal path 140. In response to a logic high TWIN<3> signal and a logic low bTWIN<3> signal, transmission gate 232 is enabled to pass the LRAc<1> signal to A<0> signal path 214. In response to a logic low TWIN<3> signal and a logic high bTWIN<3> signal, transmission gate 232 is disabled to block the LRAc<1> signal from passing to A<0> signal path 214.

The input of transmission gate 234 receives the LRAc<1> signal on LRAc<1> signal path 202. The output of transmission gate 234 provides the A<3> signal on A<3> signal path 220. The logic low enable input of transmission gate 234 receives the bTWIN<3> signal on bTWIN<3> signal path 136, and the logic high enable input of transmission gate 234 receives the TWIN<3> signal on TWIN<3> signal path 140. In response to a logic high TWIN<3> signal and a logic low bTWIN<3> signal, transmission gate 234 is enabled to pass the LRAc<1> signal to A<3> signal path 220. In response to a logic low TWIN<3> signal and a logic high bTWIN<3> signal, transmission gate 234 is disabled to block the LRAc<1> signal from passing to A<3> signal path 220.

The input of transmission gate 236 receives the LRAt<1> signal on LRAt<1> signal path 204. The output of transmission gate 236 provides the A<1> signal on A<1> signal path 216. The logic low enable input of transmission gate 236 receives the bTWIN<3> signal on bTWIN<3> signal path 136, and the logic high enable input of transmission gate 236 receives the TWIN<3> signal on TWIN<3> signal path 140. In response to a logic high TWIN<3> signal and a logic low bTWIN<3> signal, transmission gate 236 is enabled to pass the LRAt<1> signal to A<1> signal path 216. In response to a logic low TWIN<3> signal and a logic high bTWIN<3> signal, transmission gate 236 is disabled to block the LRAt<1> signal from passing to A<1> signal path 216.

The input of transmission gate 238 receives the LRAt<1> signal on LRAt<1> signal path 204. The output of transmission gate 238 provides the A<2> signal on A<2> signal path 218. The logic low enable input of transmission gate 238 receives the bTWIN<3> signal on bTWIN<3> signal path 136, and the logic high enable input of transmission gate 238 receives the TWIN<3> signal on TWIN<3> signal path 140. In response to a logic high TWIN<3> signal and a logic low bTWIN<3> signal, transmission gate 238 is enabled to pass the LRAt<1> signal to A<2> signal path 218. In response to a logic low TWIN<3> signal and a logic high bTWIN<3> signal, transmission gate 238 is disabled to block the LRAt<1> signal from passing to A<2> signal path 218.

In operation, with the second twin cell mode selected to provide a logic high TWIN<3> signal and a logic low bTWIN<3> signal, the A<0> and A<3> signals are passed the LRAc<1> signal and the A<1> and A<2> signals are passed the LRAt<1> signal to activate two word lines. Therefore, if the A<0> and A<3> signals are logic low due to a logic low LRAc<1> signal, then the A<1> and A<2> signals are logic high due to a logic high LRAt<1> signal to activate the second and third word lines driven by a master word line. If the A<1> and A<2> signals are logic low due to a logic low LRAt<1> signal, then the A<0> and A<3> signals are logic high due to a logic high LRAc<1> signal to activate the first and fourth word lines driven by a master word line.

Figure 6:
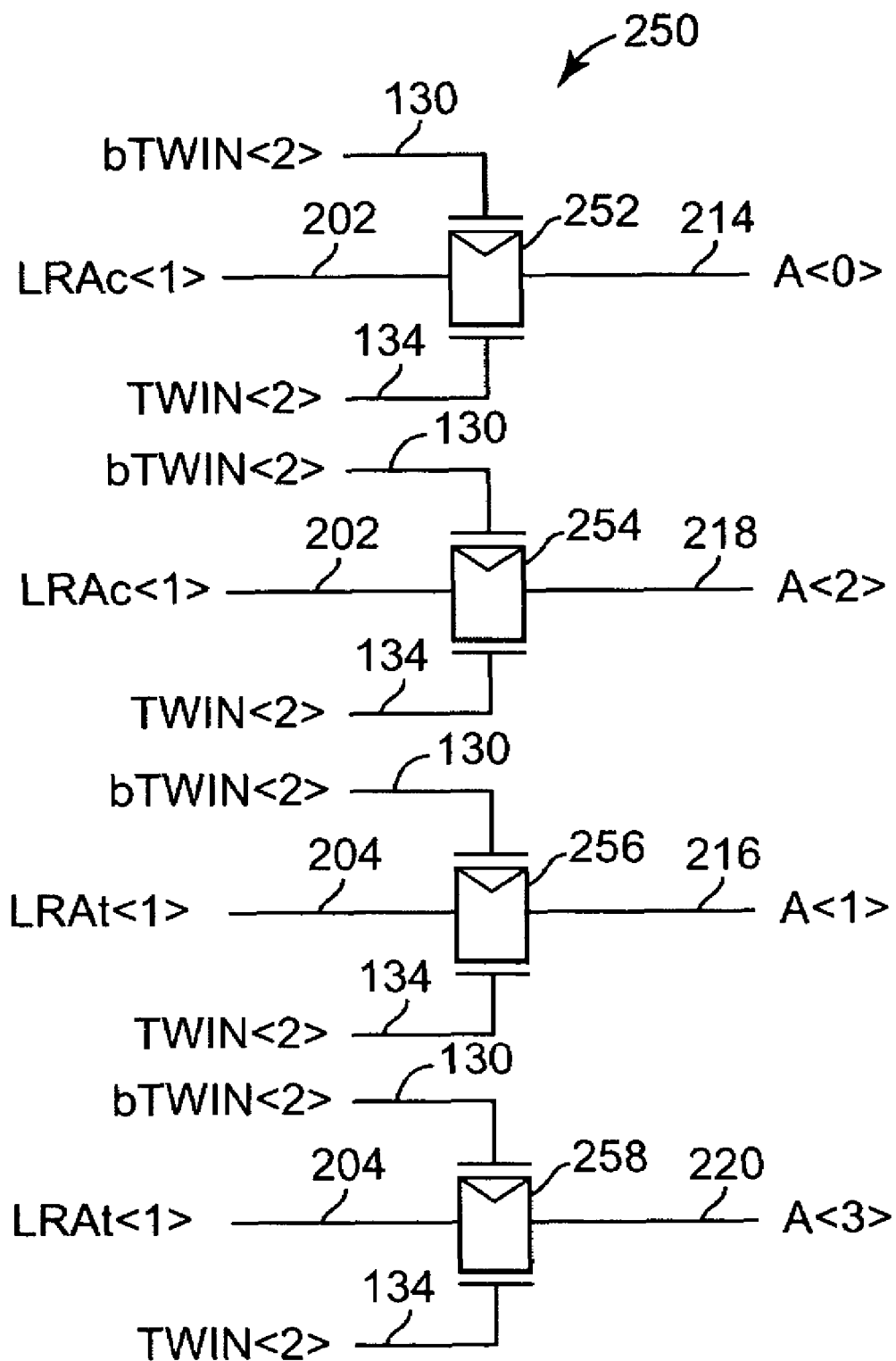
FIG. 6 is a schematic diagram illustrating one embodiment of a third portion of the row decoder for a third twin cell mode selection.

FIG. 6 is a schematic diagram illustrating one embodiment of a third portion 250 of row decoder 40 for a third twin cell mode selection. Portion 250 includes transmission gates 252, 254, 256, and 258. The input of transmission gate 252 receives the LRAc<1> signal on LRAc<1> signal path 202. The output of transmission gate 252 provides the A<0> signal on A<0> signal path 214. The logic low enable input of transmission gate 252 receives the bTWIN<2> signal on bTWIN<2> signal path 130, and the logic high enable input of transmission gate 252 receives the TWIN<2> signal on TWIN<2> signal path 134. In response to a logic high TWIN<2> signal and a logic low bTWIN<2> signal, transmission gate 252 is enabled to pass the LRAc<1> signal to A<0> signal path 214. In response to a logic low TWIN<2> signal and a logic high bTWIN<2> signal, transmission gate 252 is disabled to block the LRAc<1> signal from passing to A<0> signal path 214.

The input of transmission gate 254 receives the LRAc<1> signal on LRAc<1> signal path 202. The output of transmission gate 254 provides the A<2> signal on A<2> signal path 218. The logic low enable input of transmission gate 254 receives the bTWIN<2> signal on bTWIN<2> signal path 130, and the logic high enable input of transmission gate 254 receives the TWIN<2> signal on TWIN<2> signal path 134. In response to a logic high TWIN<2> signal and a logic low bTWIN<2> signal, transmission gate 254 is enabled to pass the LRAc<1> signal to A<2> signal path 218. In response to a logic low TWIN<2> signal and a logic high bTWIN<2> signal, transmission gate 254 is disabled to block the LRAc<1> signal from passing to A<2> signal path 218.

The input of transmission gate 256 receives the LRAt<1> signal on LRAt<1> signal path 204. The output of transmission gate 256 provides the A<1> signal on A<1> signal path 216. The logic low enable input of transmission gate 256 receives the bTWIN<2> signal on bTWIN<2> signal path 130, and the logic high enable input of transmission gate 256 receives the TWIN<2> signal on TWIN<2> signal path 134. In response to a logic high TWIN<2> signal and a logic low bTWIN<2> signal, transmission gate 256 is enabled to pass the LRAt<1> signal to A<1> signal path 216. In response to a logic low TWIN<2> signal and a logic high bTWIN<2> signal, transmission gate 256 is disabled to block the LRAt<1> signal from passing to A<1> signal path 216.

The input of transmission gate 258 receives the LRAt<1> signal on LRAt<1> signal path 204. The output of transmission gate 258 provides the A<3> signal on A<3> signal path 220. The logic low enable input of transmission gate 258 receives the bTWIN<2> signal on bTWIN<2> signal path 230, and the logic high enable input of transmission gate 258 receives the TWIN<2> signal on TWIN<2> signal path 134. In response to a logic high TWIN<2> signal and a logic low bTWIN<2> signal, transmission gate 258 is enabled to pass the LRAt<1> signal to A<3> signal path 220. In response to a logic low TWIN<2> signal and a logic high bTWIN<2> signal, transmission gate 258 is disabled to block the LRAt<1> signal from passing to A<3> signal path 220.

In operation, with the third twin cell mode selected to provide a logic high TWIN<2> signal and a logic low bTWIN<2> signal, the A<0> and A<2> signals are passed the LRAc<1> signal and the A<1> and A<3> signals are passed the LRAt<1> signal to activate two word lines. Therefore, if the A<1> and A<3> signals are logic low due to a logic low LRAt<1> signal, then the A<0> and A<2> signals are logic high due to a logic high LRAc<1> signal to activate the first and third word lines driven by a master word line. If the A<0> and A<2> signals are logic low due to a logic low LRAc<1> signal, then the A<1> and A<3> signals are logic high due to a logic high LRAt<1> signal to activate the second and fourth word lines driven by a master word line.

Figure 7:
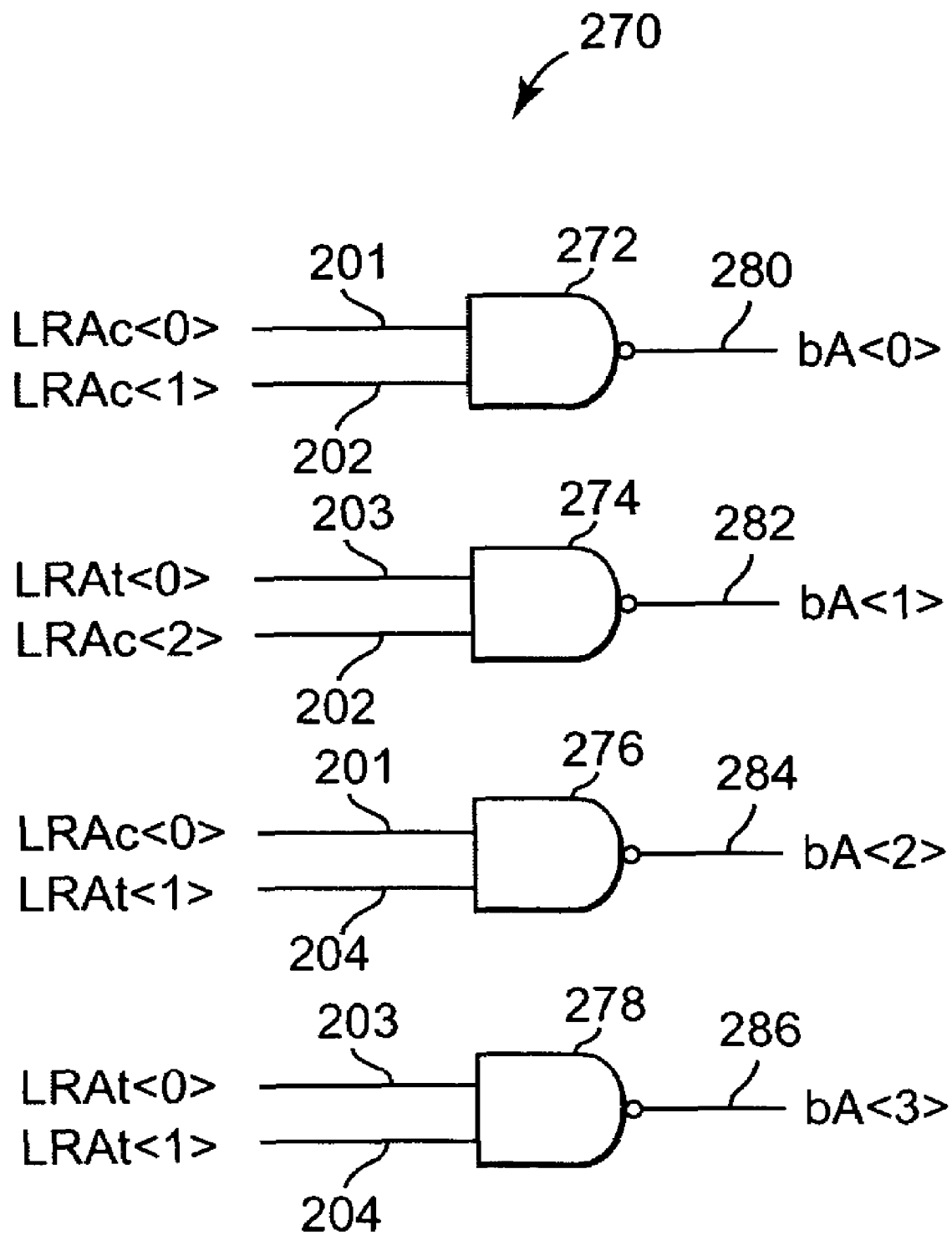
FIG. 7 is a schematic diagram illustrating one embodiment of a row address predecoder for a single cell mode.

FIG. 7 is a schematic diagram illustrating one embodiment of a row address predecoder 270 for the single cell mode. Row address predecoder 270 includes NAND gates 272, 274, 276, and 278. A first input of NAND gate 272 receives the complementary row address zero (LRAc<0>) signal indicating the complement of the least significant row address bit on LRAc<0> signal path 201. A second input of NAND gate 272 receives the LRAc<1> signal on LRAc<1> signal path 202. NAND gate 272 provides the inverted single cell address zero (bA<0>) signal on bA<0> signal path 280. In response to a logic high LRAc<0> signal and a logic high LRAc<1> signal, NAND gate 272 outputs a logic low bA<0> signal. In response to a logic low LRAc<0> signal or a logic low LRAc<1> signal, NAND gate 272 outputs a logic high bA<0> signal.

A first input of NAND gate 274 receives the true row address zero (LRAt<0>) signal indicating the true least significant row address bit on LRAt<0> signal path 203. A second input of NAND gate 374 receives the LRAc<1> signal on LRAc<1> signal path 202. NAND gate 274 provides the inverted single cell one (bA<1>) signal on bA<1> signal path 282. In response to a logic high LRAc<0> signal and a logic high LRAc<1> signal, NAND gate 274 outputs a logic low bA<1> signal. In response to a logic low LRAt<0> signal or a logic low LRAc<1> signal, NAND gate 274 outputs a logic high bA<1> signal.

A first input of NAND gate 276 receives the LRAc<0> signal on LRAc<0> signal path 201. A second input of NAND gate 276 receives the LRAt<1> signal on LRAt<1> signal path 204. NAND gate 276 provides the inverted single cell two (bA<2>) signal on bA<2> signal path 284. In response to a logic high LRAc<0> signal and a logic high LRAt<1> signal, NAND gate 276 outputs a logic low bA<2> signal. In response to a logic low LRAc<0> signal or a logic low LRAt<1> signal, NAND gate 276 outputs a logic high bA<2> signal.

A first input of NAND gate 278 receives the LRAt<0> signal on LRAt<0> signal path 203. A second input of NAND gate 278 receives the LRAt<1> signal on LRAt<1> signal path 204. NAND gate 278 provides the inverted single cell three (bA<3>) signal on bA<3> signal path 286. In response to a logic high LRAt<0> signal and a logic high LRAt<1> signal, NAND gate 278 outputs a logic low bA<3> signal. In response to a logic low LRAt<0> signal or a logic low LRAt<1> signal, NAND gate 278 outputs a logic high bA<3> signal.

In operation, row address predecoder 270 decodes the two least significant row address bits (LRAt<0:1>, LRAc<0:1>) to provide one logic low bA<0:3> signal and three logic high bA<0:3> signals. If the two least significant row address bits are '00,' then the bA<0> signal is logic low, and the bA<1> signal, bA<2> signal, and bA<3> signal are logic high. If the two least significant row address bits are '01,' then the bA<1> signal is logic low, and the bA<0> signal, bA<2> signal, and bA<3> signal are logic high. If the two least significant row address bits are '10,' then the bA<2> signal is logic low, and the bA<0> signal, bA<1> signal, and bA<3> signal are logic high. If the two least significant row address bits are '11,' then the bA<3> signal is logic low, and the bA<0> signal, bA<1> signal, and bA<2> signal are logic high.

Figure 8:
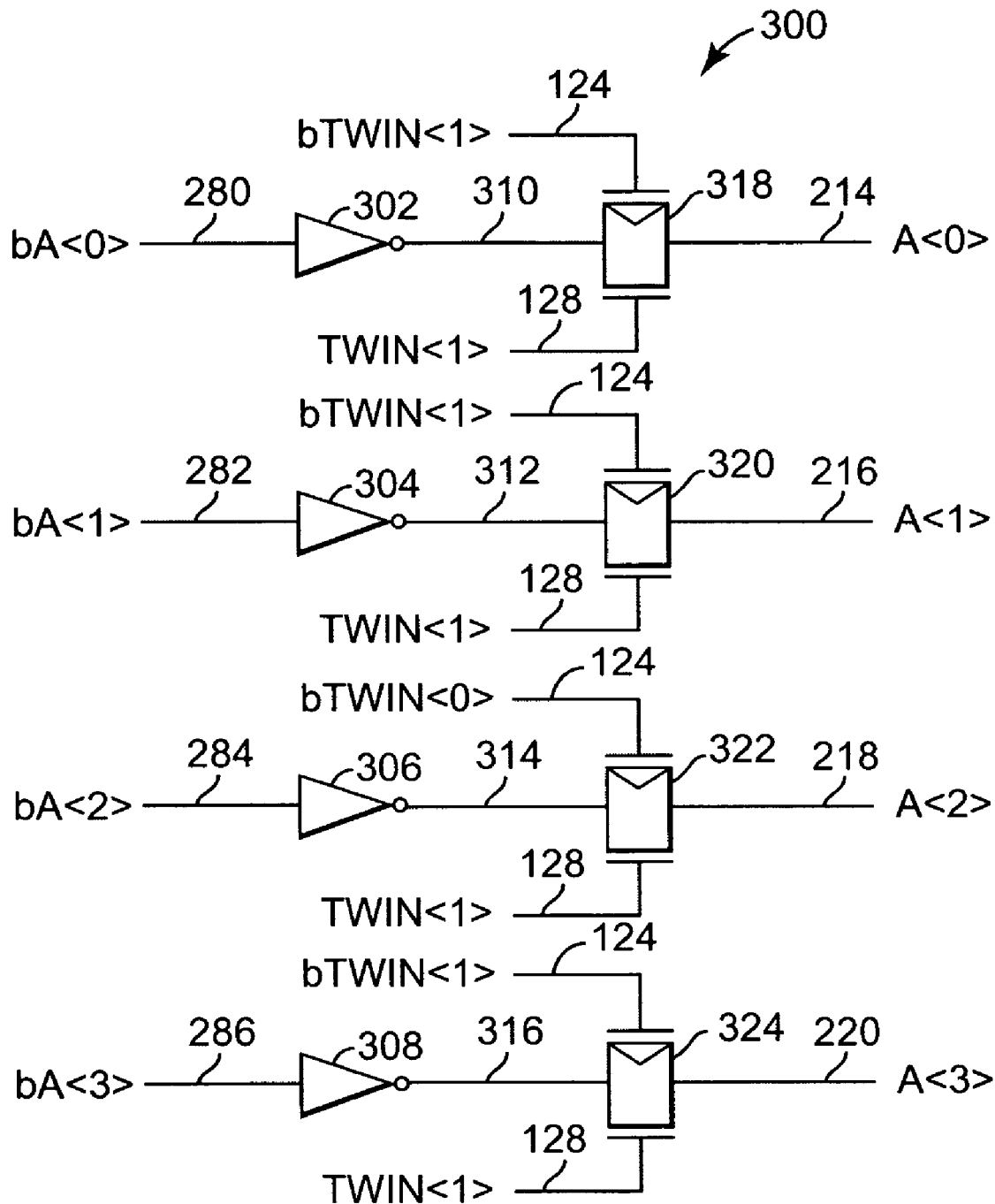
FIG. 8 is a schematic diagram illustrating one embodiment of a fourth portion of the row decoder for a single cell mode selection.

FIG. 8 is a schematic diagram illustrating one embodiment of a fourth portion 300 of row decoder 40 for a single cell test mode selection. Portion 300 includes inverters 302, 304, 306, and 308, and transmission gates 318, 320, 322, and 324. The input of inverter 302 receives the bA<0> signal on bA<0> signal path 280. The output of inverter 308 is electrically coupled to the input of transmission gate 318 through signal path 310. The output of transmission gate 318 provides the A<0> signal on A<0> signal path 214. The logic low enable input of transmission gate 318 receives the bTWIN<1> signal on bTWIN<1> signal path 124, and the logic high enable input of transmission gate 318 receives the TWIN<1> signal on TWIN<1> signal path 128. Inverter 302 inverts the bA<0> signal on bA<0> signal path 280 to provide an inverted bA<0> signal on signal path 310. In response to a logic high TWIN<1> signal and a logic low bTWIN<1> signal, transmission gate 318 is enabled to pass the inverted bA<0> signal to A<0> signal path 214. In response to a logic low TWIN<1> signal and a logic high bTWIN<1> signal, transmission gate 318 is disabled to block the inverted bA<0> signal from passing to A<0> signal path 214.

The input of inverter 304 receives the bA<1> signal on bA<1> signal path 282. The output of inverter 304 is electrically coupled to the input of transmission gate 320 through signal path 312. Transmission gate 320 provides the A<1> signal on A<1> signal path 216. The logic low enable input of transmission gate 320 receives the bTWIN<2> signal on bTWIN<2> signal path 124, and the logic high enable input of transmission gate 230 receives the TWIN<1> signal on TWIN<1> signal path 128. Inverter 304 inverts the bA<1> signal on bA<1> signal path 282 to provide an inverted bA<1> signal on signal path 312. In response to a logic high TWIN<1> signal and a logic low bTWIN<1> signal, transmission gate 320 is enabled to pass the inverted bA<1> signal to A<1> signal path 216. In response to a logic low TWIN<1> signal and a logic high bTWIN<1> signal, transmission gate 320 is disabled to block the inverted bA<1> signal from passing to A<1> signal path 216.

The input of inverter 306 receives the bA<2> signal on bA<2> signal path 284. The output of inverter 306 is electrically coupled to the input of transmission gate 322 through signal path 314. The output of transmission gate 322 provides the A<2> signal on A<2> signal path 218. The logic low enable input of transmission gate 322 receives the bTWIN<1> signal on bTWIN<1> signal path 124, and the logic high enable input of transmission gate 322 receives the TWIN<1> signal on TWIN<1> path 128. Inverter 306 inverts the bA<2> signal on bA<2> signal path 284 to provide an inverted bA<2> signal on signal path 314. In response to a logic high TWIN<1> signal and a logic low bTWIN<1> signal, transmission gate 322 is enabled to pass the inverted bA<2> signal to A<2> signal path 218. In response to a logic low TWIN<1> signal and a logic high bTWIN<1> signal, transmission gate 322 is disabled to block the inverted bA<2> signal from passing to A<2> signal path 218.

The input of inverter 308 receives the bA<3> signal on bA<3> signal path 286. The output of inverter 308 is electrically coupled to the input of transmission gate 324 through signal path 316. The output of transmission gate 324 provides the A<3> signal on A<3> signal path 220. The logic low enable input of transmission gate 324 receives the bTWIN<1> signal on bTWIN<1> signal path 124, and the logic high enable input of transmission gate 324 receives the TWIN<1> signal on TWIN<1> signal path 128. Inverter 308 inverts the bA<3> signal on bA<3> signal path 286 to provide an inverted bA<3> signal on signal path 316. In response to a logic high TWIN<1> signal and a logic low bTWIN<1> signal, transmission gate 324 is enabled to pass the inverted bA<3> signal to A<3> signal path 220. In response to a logic low TWIN<1> signal and a logic high bTWIN<1> signal, transmission gate 324 is disabled to block the inverted bA<3> signal from passing to A<3> signal path 220.

As illustrated in FIGS. 4, 5, 6, and 8, the A<0> signal, A<1> signal, A<2> signal, and A<3> signal are based on the selection of the single cell mode or one of the three twin cell modes. In the single cell mode, one of the A<0> signal, A<1> signal, A<2> signal, and A<3> signal is activated based on the two least significant row address bits to activate one of four word lines driven by a master word line. In the twin cell modes, two of the A<0> signal, A<1> signal, A<2> signal, and A<3> signal are activated based on the second least significant row address bit and the twin cell mode selected to activate two of four word lines driven by a master word line.

Figure 9:
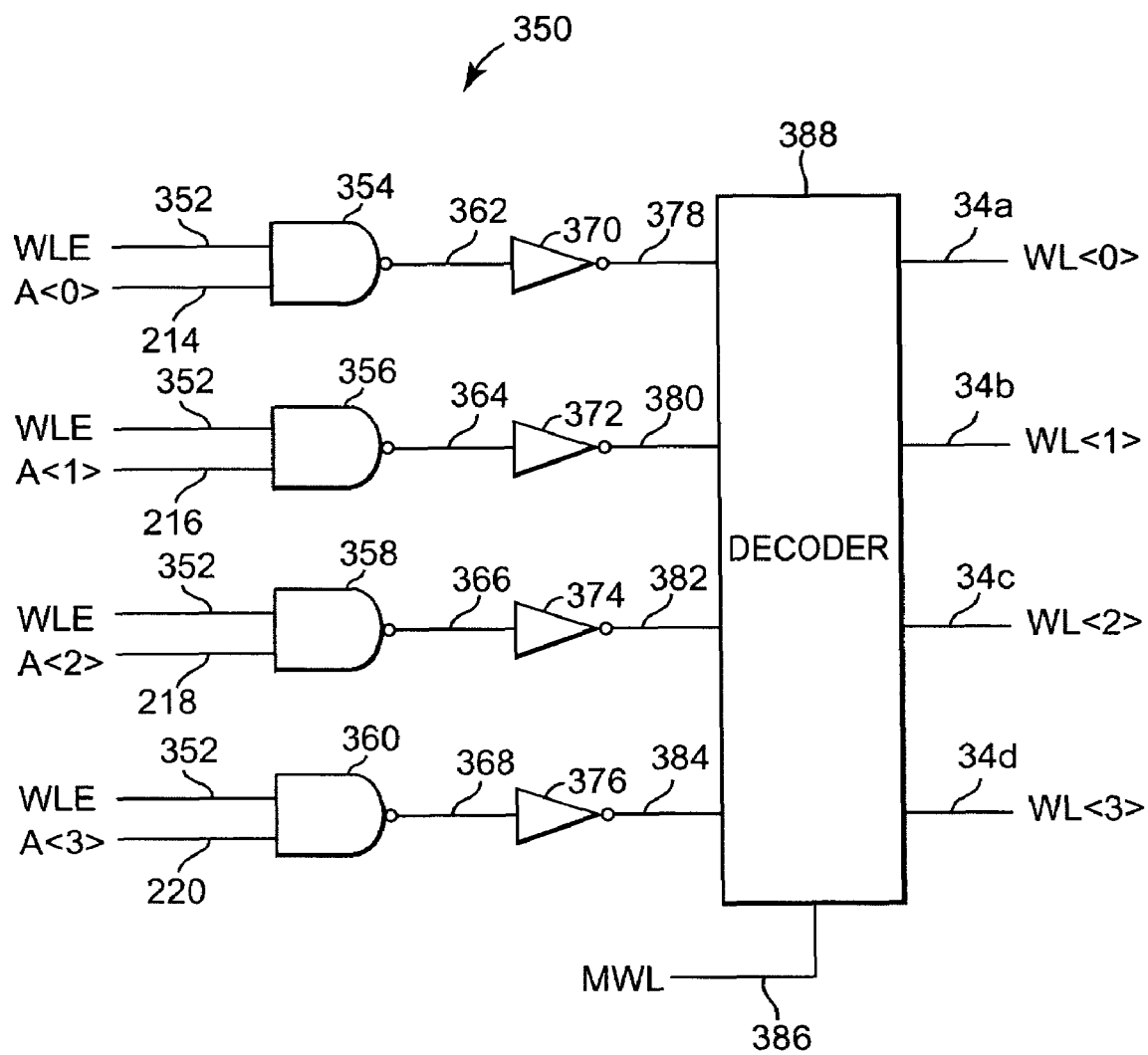
FIG. 9 is a schematic diagram illustrating one embodiment of a word line decoder.

FIG. 9 is a schematic diagram illustrating one embodiment of a word line decoder 350. In one embodiment, word line decoder 350 is part of row decoder 40. In one embodiment, a redundant word line decoder similar in structure to word line decoder 350 is also part of row decoder 40. Word line decoder 350 includes NAND gates 354, 356, 358, and 360, inverters 370, 372, 374, and 376, and decoder 388.

A first input of NAND gate 354 receives the word line enable (WLE) signal on WLE signal path 352. A second input of NAND gate 354 receives the A<0> signal on A<0> signal path 214. The output of NAND gate 354 is electrically coupled to the input of inverter 370 through signal path 362. The output of inverter 370 is electrically coupled to a first input of decoder 388 through signal path 378. In response to a logic high WLE signal and a logic high A<0> signal, NAND gate 354 outputs a logic low signal on signal path 362. In response to a logic low WLE signal or a logic low A<0> signal, NAND gate 354 outputs a logic high signal on signal path 362. Inverter 370 inverts the signal on signal path 362 to provide a signal on signal path 378.

A first input of NAND gate 356 receives the word line enable (WLE) signal on WLE signal path 352. A second input of NAND gate 356 receives the A<1> signal on A<1> signal path 216. The output of NAND gate 356 is electrically coupled to the input of inverter 272 through signal path 364. The output of inverter 372 is electrically coupled to a second input of decoder 388 through signal path 380. In response to a logic high WLE signal and a logic high A<1> signal, NAND gate 356 outputs a logic low signal on signal path 364. In response to a logic low WLE signal or a logic low A<1> signal, NAND gate 356 outputs a logic high signal on signal path 364. Inverter 372 inverts the signal on signal path 364 to provide a signal on signal path 380.

A first input of NAND gate 358 receives the word line enable (WLE) signal on WLE signal path 352. A second input of NAND gate 358 receives the A<2> signal on A<2> signal path 218. The output of NAND gate 358 is electrically coupled to inverter 374 through signal path 366. The output of inverter 374 is electrically coupled to a third input of decoder 388 through signal path 382. In response to a logic high WLE signal and a logic high A<2> signal, NAND gate 358 outputs a logic low signal on signal path 366. In response to a logic low WLE signal or a logic low A<2> signal, NAND gate 358 outputs a logic high signal on signal path 366. Inverter 374 inverts the signal on signal path 366 to provide a signal on signal path 382.

A first input of NAND gate 360 receives the word line enable (WLE) signal on WLE signal path 352. A second input of NAND gate 360 receives the A<3> signal on A<3> signal path 220. The output of NAND gate 360 is electrically coupled to the input of inverter 376 through signal path 368. The output of inverter 376 is electrically coupled to a fourth input of decoder 388 through signal path 384. In response to a logic high WLE signal and a logic high A<3> signal, NAND gate 360 outputs a logic low signal on signal path 368. In response to a logic low WLE signal or a logic low A<3> signal, NAND gate 360 outputs a logic high signal on signal path 368. Inverter 376 inverts the signal on signal path 368 to provide a signal on signal path 384.

Decoder 388 receives the signal on signal path 378, the signal on signal path 380, the signal on signal path 382, the signal on signal path 384, and a master word line (MWL) signal on MWL signal path 386. Decoder 388 provides the word line zero (WL<0>) signal on WL<0> signal path 34a, the word line one (WL<1>) signal on WL<1> signal path 34b, the word line two (WL<2>) signal on WL<2> signal path 34c, and the word line three (WL<3>) signal on WL<3> signal path 34d. Decoder 388 selects the word lines 34a-34d in the array of memory cells 32 that are driven by the master word line on MWL signal path 386. Decoder 388 is repeated for every four word lines driven by a separate master word line in the array of memory cells 32.

In operation, the WLE signal is logic high to enable word line decoder 350 and logic low to disable word line decoder 350. In one embodiment, the WLE signal is passed from memory controller 20 through communication link 22. In the single cell mode, word line decoder 350 activates one of four word lines driven by a master word line in the array of memory cells 32. In the twin cell modes, word line decoder 350 activates two of four word lines driven by a master word line in the array of memory cells 32. In response to a logic high A<0> signal and a logic high WLE signal, row decoder 350 activates word line 34a driven by the master word line in the array of memory cells 32. In response to a logic high A<1> signal and a logic high WLE signal, row decoder 350 activates word line 34b driven by the master word line in the array of memory cells 32. In response to a logic high A<2> signal and a logic high WLE signal, row decoder 350 activates word line 34c driven by the master word line in the array of memory cells 32. In response to a logic high A<3> signal and a logic high WLE signal, row decoder 350 activates word line 34d driven by the master word line in the array of memory cells 32. With the selected word lines activated based on the activated master word line and the A<0> through A<3> signals, data is written to or read from the memory cells activated by the selected word lines.

In one embodiment, at some point in word line decoder 350, the normal internal voltage ($V_{INT}$ or $V_{DD}$) for word line decoder 350 is switched to the high supply voltage ($V_{PP}$). Since the $V_{PP}$ circuitry uses considerably more current than the $V_{INT}$ or $V_{DD}$ circuitry, in one embodiment, the single cell and twin cell mode or configuration switching is implemented before shifting the voltage to $V_{PP}$.

Embodiments of the present invention provide a DRAM having a single cell mode and three twin cell modes. The DRAM memory can be tested in the single cell and/or in a twin cell mode and operated in either the single cell or a twin cell mode. The selection of a twin cell mode or the single cell mode can be temporary or permanent. By operating the DRAM memory in a twin cell mode, the refresh rate can be reduced in comparison to the single cell mode to conserve power in applications such as cellular phones or other portable electronic devices.

What is claimed is:

1. A row decoder for a dynamic random access memory comprising:
   a twin cell mode predecoder configured to selectively activate one of a first mode selection signal, a second mode selection signal, a third mode selection signal, and a fourth mode selection signal for selectively activating at least one word line of four adjacent word lines driven by a master word line;
   a first twin cell mode selection circuit configured to be activated in response to the first mode selection signal;
   a second twin cell mode selection circuit configured to be activated in response to the second mode selection signal;
   a third twin cell mode selection circuit configured to be activated in response to the third mode selection signal; and
   a single cell mode selection circuit configured to be activated in response to the fourth mode selection signal,
   wherein the second twin cell mode selection circuit is configured to activate both a first and fourth word line simultaneously or both a second and third word line simultaneously of the four adjacent word lines driven by the master word line, and
   wherein the third twin cell mode selection circuit is configured to activate both the first and third word line simultaneously or both the second and fourth word line simultaneously of the four adjacent word lines driven by the master word line.

2. The row decoder of claim 1, further comprising:
   a row address predecoder configured to decode a row address for the single cell mode selection circuit.

3. The row decoder of claim 1, further comprising:
   a word line decoder configured to activate word lines based on the activated one of the first twin cell mode selection circuit, the second twin cell mode selection circuit, the third twin cell mode selection circuit, and the single cell mode selection circuit.

4. The row decoder of claim 1, wherein the first twin cell mode selection circuit is configured to activate both the first and second word line simultaneously or both the third and fourth word line simultaneously of the four adjacent word lines driven by the master word line.

5. The row decoder of claim 1, wherein the single cell mode selection circuit is configured to activate one of the first word line, the second word line, the third word line, and the fourth word line of the four word lines driven by the master word line.

6. The row decoder of claim 1, wherein the first twin cell mode selection circuit is configured to be activated by enabling a first transmission gate in response to the first mode selection signal to pass a row address signal to a first address signal path, enabling a second transmission gate in response to the first mode selection signal to pass the row address signal to a second address signal path, enabling a third transmission gate in response to the first mode selection signal to pass a complementary address signal to a third address signal path, and enabling a fourth transmission gate in response to the first mode selection signal to pass the complementary address signal to a fourth address signal path, wherein the first address signal path, the second address signal path, the third address signal path, and the fourth address signal path are used for selectively activating two of four word lines driven by a master word line.

7. A cellular random access memory comprising:
   an array of memory cells having word lines; and
   a row decoder coupled to the array of memory cell, the row decoder comprising:
      a twin cell mode predecoder configured to selectively activate one of a first mode selection signal, a second mode selection signal, a third mode selection signal, and a fourth mode selection signal;
      a first twin cell mode selection circuit configured to be activated in response to the first mode selection signal;
      a second twin cell mode selection circuit configured to be activated in response to the second mode selection signal;
      a third twin cell mode selection circuit configured to be activated in response to the third mode selection signal; and
      a single cell mode selection circuit configured to be activated in response to the fourth mode selection signal;
      a row address predecoder configured to decode a row address for the single cell mode selection circuit; and
      a word line decoder configured to activate selected word lines based on the activated one of the first twin cell mode selection circuit, the second twin cell mode selection circuit, the third twin cell mode selection circuit, and the single cell mode selection circuit,
      wherein the word line decoder is configured to activate both a first and fourth word line simultaneously or both a second and third word line simultaneously of four adjacent word lines driven by a master word line in response to the second twin cell mode selection circuit being activated, and
      wherein the word line decoder is configured to activate both the first and third word line simultaneously or both the second and fourth word line simultaneously of the four adjacent word lines driven by the master word line in response to the third twin cell mode selection circuit being activated.

8. The memory of claim 7, wherein the word line decoder is configured to activate both the first and second word line simultaneously or both the third and fourth word line simultaneously of the four adjacent word lines driven by the master word line in response to the first twin cell mode selection circuit being activated.

9. The memory of claim 7, wherein the word line decoder is configured to activate one of the first word line, the second word line, the third word line, and the fourth word line of the four word lines driven by the master word line in response to the single cell mode selection circuit being activated.

10. A row decoder for a dynamic random access memory comprising:
    a twin cell mode predecoder configured to selectively activate one of a first mode selection signal, a second mode selection signal, a third mode selection signal, and a fourth mode selection signal;
    a first twin cell mode selection circuit configured to be activated in response to the first mode selection signal;
    a second twin cell mode selection circuit configured to be activated in response to the second mode selection signal;
    a third twin cell mode selection circuit configured to be activated in response to the third mode selection signal; and
    a single cell mode selection circuit configured to be activated in response to the fourth mode selection signal,
    wherein the first twin cell mode selection circuit is configured to activate both a first and second word line simultaneously or both a third and fourth word line simultaneously of four adjacent word lines driven by a master word line,
    wherein the third twin cell mode selection circuit is configured to activate both the first and third word line simultaneously or both the second and fourth word line simultaneously of the four adjacent word lines driven by the master word line, and
    wherein the second word line is adjacent the first word line, the third word line is adjacent the second word line, and the fourth word line is adjacent the third word line.

11. The row decoder of claim 10, further comprising:
    a row address predecoder configured to decode a row address for the single cell mode selection circuit.

12. A row decoder for a dynamic random access memory comprising:
    a twin cell mode predecoder configured to selectively activate one of a first mode selection signal, a second mode selection signal, a third mode selection signal, and a fourth mode selection signal;
    a first twin cell mode selection circuit configured to be activated in response to the first mode selection signal;
    a second twin cell mode selection circuit configured to be activated in response to the second mode selection signal;
    a third twin cell mode selection circuit configured to be activated in response to the third mode selection signal; and
    a single cell mode selection circuit configured to be activated in response to the fourth mode selection signal,
    wherein the second twin cell mode selection circuit is configured to activate both a first and fourth word line simultaneously or both a second and third word line simultaneously of four adjacent word lines driven by a master word line, and
    wherein the second word line is adjacent the first word line, the third word line is adjacent the second word line, and the fourth word line is adjacent the third word line.

13. The row decoder of claim 12, further comprising:
    a row address predecoder configured to decode a row address for the single cell mode selection circuit.

14. A row decoder for a dynamic random access memory comprising:
    a twin cell mode predecoder configured to selectively activate one of a first mode selection signal, a second mode selection signal, a third mode selection signal, and a fourth mode selection signal;
    a first twin cell mode selection circuit configured to be activated in response to the first mode selection signal;
    a second twin cell mode selection circuit configured to be activated in response to the second mode selection signal;
    a third twin cell mode selection circuit configured to be activated in response to the third mode selection signal; and
    a single cell mode selection circuit configured to be activated in response to the fourth mode selection signal,
    wherein the third twin cell mode selection circuit is configured to activate both a first and third word line simultaneously or both a second and fourth word line simultaneously of four adjacent word lines driven by a master word line, and
    wherein the second word line is adjacent the first word line, the third word line is adjacent the second word line, and the fourth word line is adjacent the third word line.

15. The row decoder of claim 14, further comprising:
    a row address predecoder configured to decode a row address for the single cell mode selection circuit.

16. A row decoder for a dynamic random access memory comprising:
    a twin cell mode predecoder configured to selectively activate one of a first mode selection signal, a second mode selection signal, a third mode selection signal, and a fourth mode selection signal;
    a first twin cell mode selection circuit configured to be activated in response to the first mode selection signal;
    a second twin cell mode selection circuit configured to be activated in response to the second mode selection signal;
    a third twin cell mode selection circuit configured to be activated in response to the third mode selection signal; and
    a single cell mode selection circuit configured to be activated in response to the fourth mode selection signal,
    wherein the single cell mode selection circuit is configured to activate one of a first word line, a second word line, a third word line, and a fourth word line of four adjacent word lines driven by a master word line,
    wherein the second twin cell mode selection circuit is configured to activate both the first and fourth word line simultaneously or both the second and third word line simultaneously of four adjacent word lines driven by the master word line, and wherein the second word line is adjacent the first word line, the third word line is adjacent the second word line, and the fourth word line is adjacent the third word line.

17. The row decoder of claim 16, further comprising:
a row address predecoder configured to decode a row address for the single cell mode selection circuit.

18. A row decoder for a dynamic random access memory comprising:
a twin cell mode predecoder configured to selectively activate one of a first mode selection signal, a second mode selection signal, a third mode selection signal, and a fourth mode selection signal;
a first twin cell mode selection circuit configured to be activated in response to the first mode selection signal;
a second twin cell mode selection circuit configured to be activated in response to the second mode selection signal;
a third twin cell mode selection circuit configured to be activated in response to the third mode selection signal; and
a single cell mode selection circuit configured to be activated in response to the fourth mode selection signal,
wherein the first twin cell mode selection circuit is configured to be activated by enabling a first transmission gate in response to the first mode selection signal to pass a row address signal to a first address signal path, enabling a second transmission gate in response to the first mode selection signal to pass the row address signal to a second address signal path, enabling a third transmission gate in response to the first mode selection signal to pass a complementary address signal to a third address signal path, and enabling a fourth transmission gate in response to the first mode selection signal to pass the complementary address signal to a fourth address signal path, wherein the first address signal path, the second address signal path, the third address signal path, and the fourth address signal path are used for selectively activating two of four word lines driven by a master word lines,
wherein the second twin cell mode selection circuit is configured to activate both a first and fourth word line simultaneously or both a second and third word line simultaneously of four adjacent word lines driven by the master word line, and
wherein the third twin cell mode selection circuit is configured to activate both the first and third word line simultaneously or both the second and fourth word line simultaneously of the four adjacent word lines driven by the master word line.

19. The row decoder of claim 18, further comprising:
a row address predecoder configured to decode a row address for the single cell mode selection circuit.

\* \* \* \* \*